United States Patent [19]

Valkestijn

[11] 4,216,392

[45] Aug. 5, 1980

[54] CIRCUIT FOR PRODUCING A PERIODIC PARABOLIC SIGNAL

[75] Inventor: Leonardus A. A. Valkestijn, Eindhoven, Netherlands

[73] Assignee: U.S. Philips Corporation, New York, N.Y.

[21] Appl. No.: 892,788

[22] Filed: Apr. 3, 1978

[30] Foreign Application Priority Data

Apr. 14, 1977 [NL] Netherlands .......................... 7704062

[51] Int. Cl.² ............................................. H03K 4/04
[52] U.S. Cl. .................................... 307/268; 307/230; 307/246; 307/261; 328/187
[58] Field of Search ............... 307/230, 246, 261, 268; 328/187

[56] References Cited

U.S. PATENT DOCUMENTS

| | | | |
|---|---|---|---|
| 3,181,079 | 4/1965 | Bregman | 307/230 X |
| 3,258,609 | 6/1966 | Verstraelen | 307/230 |
| 3,394,266 | 7/1968 | Marten et al. | 307/230 X |
| 3,684,896 | 8/1972 | Bolinger | 307/246 X |

Primary Examiner—John S. Heyman
Attorney, Agent, or Firm—Thomas A. Briody; William J. Streeter; Edward W. Goodman

[57] ABSTRACT

A circuit for producing a periodic parabolic signal by means of squaring a sawtooth-shaped signal, for example for controlling an east-west modulator in color television receivers, a parabolic disturbance occurring during the retrace period being reduced by means of a transistor amplifier operating as an emitter follower during the trace period and as a switch during the retrace period.

6 Claims, 5 Drawing Figures

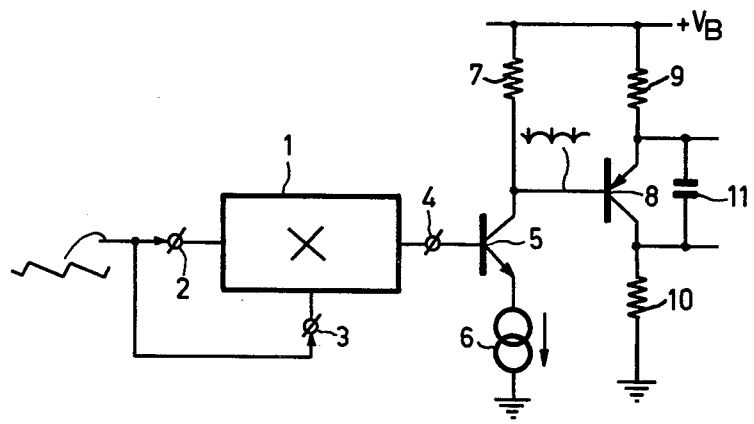
Fig.1
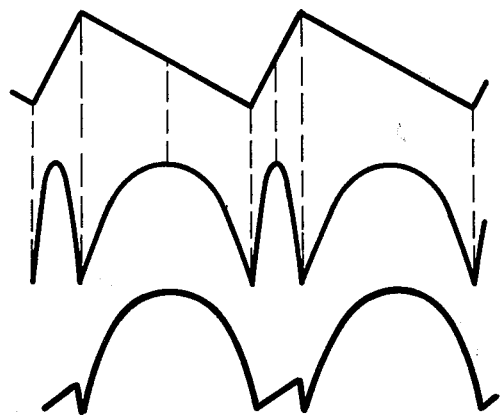
Fig.2a
Fig.2b
Fig.3a
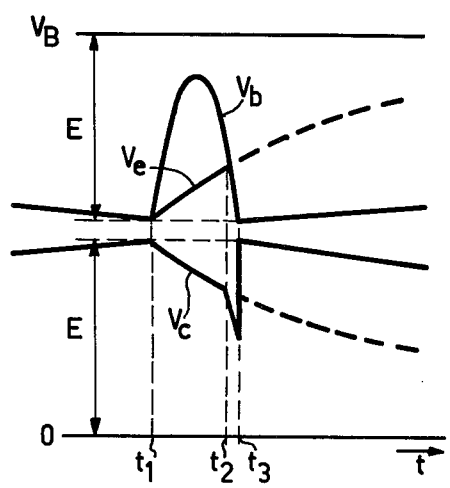
Fig.3b

CIRCUIT FOR PRODUCING A PERIODIC PARABOLIC SIGNAL

BACKGROUND OF THE INVENTION

The invention relates to a circuit for producing a period parabolic signal comprising a squaring stage for changing a sawtooth-shaped signal having a trace at a retrace and the same frequency.

Such a circuit is known. Its purpose is for example to obtain the parabolic control voltage of field frequency in color television receivers for the east-west modulator with which the distortion in the horizontal direction of the displayed picture is corrected. Another application thereof is producing the parabolic voltage for the dynamic focussing for a picture display tube or for a pick-up tube. An advantage of the method of multiplying two sawtooth-shaped signals relative to the known integration method of a sawtooth-shaped signal by means of a low-pass filter is that a disturbing low-frequency oscillation phenomena cannot occur, whereas, furthermore, the circuit is easily integratable in a semiconductor body. A further known squaring method is the use of a fullwave rectifier which, however, has the drawback, relative to the multiplying method, that it produces more harmonics.

With the integration method the edge occurring during the retrace period is also integrated to a parapolic shape. Relative to the parabola occurring during the trace period, this parabola has the opposite concavity and a much smaller amplitude, as the retrace period is many times shorter than the trace period. The two parabolas obtained have a continuous transition. However, by means of the squaring method a disturbing voltage peak is produced during the retrace period. This is caused by the fact that the parabola then occurring has the same concavity and the same amplitude as the parabola occurring during the trace period. This voltage peak may produce visible ringing phenomena on the display screen due to the fact that the circuit, formed by the line deflection coil, the line trace capacitor etc. is excited, to which circuit the parabolic signal produced by the present circuit is supplied through the modulator. Namely, at the top of the screen vertical straight lines are displayed as undulating lines, and this more at the sides of the screen then in the middle thereof.

It is clear that the disturbing ringing can be damped by means of a resistor disposed in a suitable place in the deflection circuit. However, a considerable amount of energy is lost in this resistor, while the proper operation of the modulator can be seriously disturbed. Another solution is to make the present circuit or the modulator, for example by means of a suppression circuit, inoperative during the field retrace period. A drawback thereof is that steep edges and, consequently, also the ringing phenomena may yet be produced.

SUMMARY OF THE INVENTION

It is an object of the invention to provide a simple circuit with which the disturbing voltage peak is reduced to a great extent while the desired waveform, occurring during the trace period, is substantially not affected, so that the advantage of squaring can be utilized. To that end the circuit according to the invention is characterized by a transistor amplifier with an input electrode for receiving the parabolic signal, a first output electrode thereof being connected to a first terminal of a supply voltage source through a first load and a second output electrode thereof being connected to the second terminal of the supply voltage source through a second load, both loads having a resistance value, while both output electrodes are interconnected by means of a capacitance, whereby in operation the signal at the input electrode of the amplifier varies in a blocking sense at the beginning of the trace period, the time constant of the network constituted by the capacitance and both loads being large relative to the duration of the retrace period and small relative to the duration of the trace period.

DESCRIPTION OF THE DRAWING

The invention will be explained in greater detail by way of non-limitative example with reference to the accompanying figures in which FIG. 1 shows an embodiment of the circuit according to the invention;

FIGS. 2a and 2b show the production of the disturbing signal and

FIGS. 3a and 3b show waveforms which occur in the circuit according to the invention.

DESCRIPTION OF THE PREFERRED EMBODIMENT

FIG. 1 shows a circuit which produces a parabolic control signal of field frequency for an east-west modulator in a color television receiver. Herein reference 1 represents a multiplying stage known in the art. Sawtooth signals of field frequency are supplied with the same phase to two input terminals 2 and 3 of stage 1. Terminals 2 and 3 may have been interconnected for supplying the same signal to them, for example the sawtooth voltage which is found across a feedback resistor of a field deflection generator (not shown). A parabolic signal is available at an output terminal 4 of stage 1. Stage 1 can also comprise networks with which small, desired deviations relative to the pure parabolic form can be obtained in known manner. The output of the stage 1 is then applied to a transistor amplifier. The base of a transistor 5 is connected to terminal 4, the emitter is connected, through a current source 6, to ground and the collector through a resistor 7 of, for example, 27 k $\Omega$ to the positive terminal of a power supply source $V_B$. The negative terminal of source $V_B$ is connected to ground.

FIG. 2a shows the input signal of stage 1 whereas FIG. 2b shows the output signal thereof or the input signal to transistor 5. Each edge of the sawtooth of FIG. 2a is squared to a parabola by stage 1. The parabolas obtained in FIG. 2b have the same concavity and the same amplitude, whereas the transition from the one to the following parabola is discontinuous. Because the retrace period of the sawtooth is very short relative to the field period, i.e. 0.2 to 1.2 ms relative to 20 ms at a field frequency of 50 Hz, the edges of the parabola produced during the flyback period are very steep which may give rise to the above-mentioned disturbing phenomena.

In accordance with the invention the signal available at the collector of transistor 5 is applied to the base of a transistor 8, the signal having such a shape and the transistor 8 being of such a conductivity type that the signal varies in a blocking sense at the beginning of the trace period, that is to say the voltage at the base decreases relative to the supply voltage of the emitter. In FIG. 1 transistor 8 is of the pnp type whereas the base voltage is of the form shown in FIG. 2b. A resistor 9 is included between the emitter of transistor 8 and the positive terminal of source $V_B$ and a resistor 10 between the collector of transistor 8 and ground. Resistors 9 and 10 may have approximately the same values, for example 22 k Ω. One side of a capacitor of, for example, 100 nF is connected to the emitter and the other side to the collector of transistor 8. From the preceding it appears that the voltage between the base and the supply source decreases during the first halves of the trace and the retrace period and increases during the second havles thereof.

If the voltage $V_B$-E at the base of transistor 8 is constant then the transistor behaves as an emitter follower. Neglecting the base-emitter voltage, it may be assumed that a voltage equal to E is present across resistor 9 and, consequently, also across resistor 10. Capacitor 11 is charged by a current originating from source $V_B$, and after charging, a constant voltage $V_B$-2E remains across this capacitor.

The same of course applies with another value of voltage E. If voltage E varies slowly then the emitter voltage continuously follows the variation of voltage $V_B$-E while the collector voltage, which is equal to E, varies in the opposite sense relative to the emitter voltage. If, for example, the voltage $V_B$-E at the base slowly increases then the capacitor 11 is slowly charged to a higher voltage. It is clear that the time constant of the network formed by resistors 9 and 10 and capacitor 11 plays a role therein.

The operation of transistor 8 at a rapid variation of the base voltage is explained with reference to FIG. 3a, and in particular, 3b. It should be noted that FIG. 3b is not drawn to scale but pictorially represents the operation of the circuit. Herein $V_e$ and $V_c$ respectively represent the emitter and collector voltage transistor 8, the base-emitter voltage of the transistor being neglected for simplicity. $V_b$ represents the base voltage during the retrace period, the variation thereof is, from an instant $t_1$, parabolic with an initial voltage equal to $V_B$-E.

If the time constant of network 9, 10, 11 is large relative to the duration of the retrace period then voltage $V_e$ cannot follow the positive-going variation of voltage $V_b$ and transistor 8 is cut-off. Capacitor 11 is charged by a current which also flows through resistors 9 and 10 so that the variation of voltage $V_e$ is exponential. Voltage $V_c$, which has the value E at instant $t_1$ decreases exponentially after this instant. Should transistor 8 remain cutoff then the final values of voltages $V_e$ and $V_c$ would be equal to $V_B$ and O, respectively.

At an instant $t_2$, however, voltage $V_b$ assumes, after having attained a maximum, a value which is equal to that of voltage $V_e$. Transistor 8 starts conducting and voltage $V_c$ follows the parabola to the end thereof at an instant $t_3$. The variation of voltage $V_e$ between instants $t_2$ and $t_3$ is so rapid that the voltage across capacitor 11 cannot essentially vary. So capacitor 11 passes the variation of the emitter on to the collector. At instant $t_3$ the capacitor 11 discharges in the resistance constituted by the emitter-collector path of the transistor 8. Because this resistance has a very low value, this discharge occurs very rapidly whereafter voltage $V_c$ assumes the final value which in FIG. 3b is assumed to be equal E. After instant $t_3$ the next trace period follows. FIG. 3a shows the full composite output waveform at the capacitor 11.

The variation of voltage $V_b$ during the trace period is also parabolic and might also be shown as in FIG. 3b. However, it is a slow variation which means that the duration thereof is long relative to the time constant referred to above. If the time constant is too large then it appears from FIG. 3b that the transistor 8 will not conduct during a portion of the trace period so that the signal at the emitter has an exponential variation and is seriously distorted relative to the parabola. In addition it is ensured that the emitter-follower operation cannot be disturbed if the difference between voltage $V_B$ and the peak value of voltage $V_b$ is not too small. A compromise can be found wherein the a.c. voltage at the emitter is substantially identical to that at the base. This is the case in the above-mentioned embodiment in which a value of $V_B=34V$ is chosen for the supply voltage whereas $V_b$ varies between 18 and 26 V, said time constant being 4.4 ms.

With these values the disturbance still remaining between instants $t_1$ and $t_3$ has an amplitude of approximately 1.4 V at a retrace period $t_1$ to $t_3$ of 0.4 ms and of approximately 0.7 V at a retrace period of 0.2 ms, instead of the original amplitude of the disturbance of 26−18=8 V. It is true that the collector voltage comprises an additional disturbance between instants $t_2$ and $t_3$, but the duration thereof is so short and the amplitude so small that it contains little energy and can have no detrimental influence. The remaining disturbance can be reduced still further by introducing a slight unbalance in stage 1 so that the values of voltage $V_b$ at instants $t_1$ and $t_3$ are not exactly equal to one another.

Both the duration $t_1$ to $t_3$ of the remaining disturbance and the amplitude thereof can be reduced by reducing the retrace period of the sawtooth of FIG. 2a. For this purpose the semiconductor body of which stage 1 and the transistor amplifier are part may comprise a sawtooth generator which is synchronized by signals of field frequency and which produce a sawtooth having a reduced retrace period, that is to say shorter than, for example, 0.2 ms. Such a measure has the advantage that capacitor 11 may be of such a small capacitance that it can be integrated in the semiconductor body, just like transistor 8 and resistors 9 and 10. In addition, resistors 9 and 10 may have a high value in the manner known in the integration technology so that capacitor 11 may have a still smaller capacitance.

In a practical embodiment of the circuit it must be possible for the control signal of the east-west modulator to have during the trace period either the concavity of the signal of FIG. 2b or the concavity opposite thereof. For it is frequently not known in advance which concavity the user of the circuit will need. This is possible with the circuit of FIG. 1, provided the emitter and the collector of transistor 8 are each connected to an output terminal of the body. A suitable point of the east-west modulator, not shown in FIG. 1, for example the base of a transistor which constitutes a load of field frequency, of the modulator described in Applicant's Dutch Patent Application 7301421 (PHN 6734) is connected thereto.

It will be clear that a parabola having the concavity which is opposite to FIG. 2b can be applied to transistor 8, on the condition that this transistor is chosen to be of the npn type and that the place of the emitter and the collector is interchanged as compared with FIG. 1. From the foregoing it appears that for slow signals the transistor 8 behaves as an emitter-follower inverting stage and for rapid signals substantially as a switch. An integrator may also be used, for example with capacitor 11 in FIG. 1 being in parallel with resistor 10. The disturbance can be integrated at a suitable dimensioning thereof. However, the useful signal occurring during the trace period is then also integrated, which causes a distortion and a phase shift of the signal. This drawback is obviated if capacitor 11 is in parallel with resistor 9 so that transistor 8 functions as a switch for the disturbance, which, however, has the drawback that the transistor also operates as an amplifier without feedback, which may produce instability for high frequencies. Consequently the circuit of FIG. 1 should be preferred.

What is claimed is:

1. A circuit for producing a periodic parabolic signal from a sawtooth-shaped signal, having a trace and a retrace period, with the same frequency, wherein said periodic parabolic signal has a suppressed amplitude during said retrace period, said circuit comprising a squaring stage having an input to which said sawtooth-shaped signal is applied, wherein said squaring stage produces a periodic parabolic signal having an amplitude during the retrace period of said sawtooth-shaped signal which is substantially identical to the amplitude theeof during said retrace period; a transistor amplifier having an input electrode and a first and a second output electrode, said input electrode being coupled to said squaring stage wherein the signal therefrom varies in a blocking sense at the beginning of said trace period; a supply voltage source having a first and a second terminal; a first and a second load, both of said loads being resistive, said first load being coupled between said first output electrode of said transistor amplifier and said first terminal of said supply voltage source and said second load being coupled between said second output electrode of said transistor amplifier and said second terminal of said supply voltage source; and capacitance means for coupling said first output electrode of said transistor amplifier to said second output electrode thereof, wherein said capacitance means and said first and second loads have correlating values such that the resulting time constant thereof is large relative to the duration of said retrace period and small relative to the duration of said trace period.

2. A circuit as claimed in claim 7, wherein the transistor amplifier comprises a transistor which operates as an emitter follower during the trace period, the first and second loads respectively being an emitter and a collector resistor.

3. a circuit as claimed in claim 2, wherein the emitter and the collector resistor have substantially the same values.

4. A circuit as claimed in claim 7, wherein the transistor amplifier operates as a switch during the retrace period.

5. A circuit as claimed in claim 7, wherein the retrace period is very short relative to the duration of the trace period, for example more than 100 times as short.

6. A circuit as claimed in claims 1, 2, 3, 4 or 5, wherein at least a sawtooth generator in combination with the squaring stage, the transistor amplifier, the first and second loads and the capacitance means may be integrated into a semiconductor body.

* * * * *